United States Patent
Chang et al.

(10) Patent No.: US 8,304,787 B2
(45) Date of Patent: Nov. 6, 2012

(54) LIGHT-EMITTING DEVICE AND THE MANUFACTURING METHOD THEREOF

(75) Inventors: Chung-Ying Chang, Hsinchu (TW); Wen-Jia Huang, Hsinchu (TW); Chao-Hsu Lai, Hsinchu (TW); Tien Kun Lin, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 318 days.

(21) Appl. No.: 12/795,169

(22) Filed: Jun. 7, 2010

(65) Prior Publication Data
US 2010/0308348 A1      Dec. 9, 2010

(30) Foreign Application Priority Data
Jun. 8, 2009   (TW) .............................. 98119155 A

(51) Int. Cl.
*H01L 27/15*       (2006.01)
(52) U.S. Cl. ................................. 257/88; 257/E27.12

(58) Field of Classification Search ............. 257/72, 257/88, 98, E27.12, 99, 103, 192, 615, E29.089, 257/E31.019, E33.023, E21.002, E21.04; 438/22, 42, 46, 47
See application file for complete search history.

(56) References Cited

U.S. PATENT DOCUMENTS
7,449,722 B2   11/2008  Konno et al.

FOREIGN PATENT DOCUMENTS
CN    1909257 A    2/2007

*Primary Examiner* — Benjamin Sandvik
*Assistant Examiner* — Whitney T Moore
(74) *Attorney, Agent, or Firm* — Muncy, Geissler, Olds & Lowe, PLLC

(57) ABSTRACT

A light-emitting device having a light-emitting epitaxy structure. The light-emitting epitaxy structure has a modulus of a critical reverse voltage not less than 50 volts, while the light-emitting epitaxy structure is reverse-biased at a current density of $-10\ \mu A/mm^2$, and has a luminous efficiency not less than 50 lumen/Watt, while the light-emitting epitaxy structure is forward-biased at a current density of $150\ mA/mm^2$.

20 Claims, 8 Drawing Sheets

LIGHT-EMITTING DEVICE AND THE MANUFACTURING METHOD THEREOF

This application claims the right of priority based on TW application Ser. No. 098119155 filed on Jun. 8, 2009; the contents of which are incorporated herein by reference in its entirety.

BACKGROUND

1. Technical Field

The present disclosure relates to a light-emitting device and the manufacturing method thereof.

2. Description of the Related Art

Light-emitting diode (LED) possesses the intrinsic characteristics of rectifying current and emitting light. When LED is forward biased, the current is dramatically rising in a forward direction as the driving voltage crossing the LED is gradually increased and therefore light is emitted with a corresponding wavelength. The driving voltage at which the current starts to be rapidly rising is normally called forward voltage (Vf). Contrarily, when the LED is reverse-biased, the driving voltage crossing the LED has to reach a critical value so that the current is noticeably rising. The reverse-biased driving voltage at which the current starts to be noticeably rising is normally called reverse voltage (Vr).

The ordinary Vr value of gallium nitride (GaN) based LED is usually around −15~−20 volts. The poor Vr performance is normally caused by defects existed in the epitaxy thin film, such as lattice dislocation, impurities, and other parasitical leakage path so the device is not able to resist strict reverse-bias condition. Therefore the LED fails or breaks down easily during operation.

SUMMARY OF THE DISCLOSURE

The present disclosure provides a light-emitting device having a high critical reverse voltage and the manufacturing method thereof.

The present disclosure provides a light-emitting device comprising a light-emitting epitaxy structure. The light-emitting epitaxy structure has a modulus of a critical reverse voltage not less than 50 volts while the light-emitting epitaxy structure is reverse-biased at a current density of −10 $\mu A/mm^2$, and has a luminous efficiency not less than 50 lumen/Watt while the light-emitting epitaxy structure is forward-biased at a current density of 150 $mA/mm^2$. The definition of "critical reverse voltage" of the present disclosure is hereby defined as the reverse voltage as measured from a light-emitting epitaxy structure reverse-biased at a current density of −10 $\mu A/mm^2$.

Another aspect of the present disclosure provides a light-emitting wafer comprising a plurality of light-emitting segments, wherein an average of the modulus of the critical reverse voltages of the plurality of light-emitting segments is not less than 50 volts while the plurality of light-emitting segments are reverse-biased at a current density of −10 $\mu A/mm^2$.

Another aspect of the present disclosure provides an alternating-current light-emitting device (ACLED) comprising a plurality of light-emitting arrayed structures (LEASs) on a substrate. Each of the plurality of LEASs comprises at least one light-emitting segment. The plurality of light-emitting arrayed structures comprise a plurality of rectifying light-emitting arrayed structures (RLEASs) and at least one direct-current light-emitting arrayed structure (DCLEAS). Each of the RLEASs comprises a first number of the light-emitting segments. The plurality of RLEASs are connected to form a Wheatstone bridge having two input terminals for receiving an alternating-current signal and two output terminals for outputting a direct-current signal. The DCLEAS comprises a second number of the light-emitting segments electrically connected to the two output terminals, wherein the percentage of the total number of the light-emitting segments of the DCLEAS to the total number of the light-emitting segments of the RLEASs is not less than 50%.

Another aspect of the present disclosure provides a manufacturing method for a light-emitting device. The method comprises the steps of providing a substrate, growing a first epitaxial layer on the substrate with a first growth condition, growing a process-transition layer on the first epitaxial layer with a second growth condition, and growing a second epitaxial layer on the process-transition layer with a third growth condition, wherein a process change exists in the first growth condition and the third growth condition, and wherein the electrical conductivity of the process-transition layer is greater than that of the first epitaxial layer and/or the second epitaxial layer. According to one embodiment of the present embodiment, the manufacturing method further comprises growing a second process-transition layer on the second epitaxial layer with a fourth growth condition; and growing a third epitaxial layer on the second process-transition layer with a fifth growth condition, wherein the electrical conductivity of the second process-transition layer is greater than that of the second epitaxial layer and/or the third epitaxial layer.

DETAILED DESCRIPTION OF THE EMBODIMENTS

Figure 1:
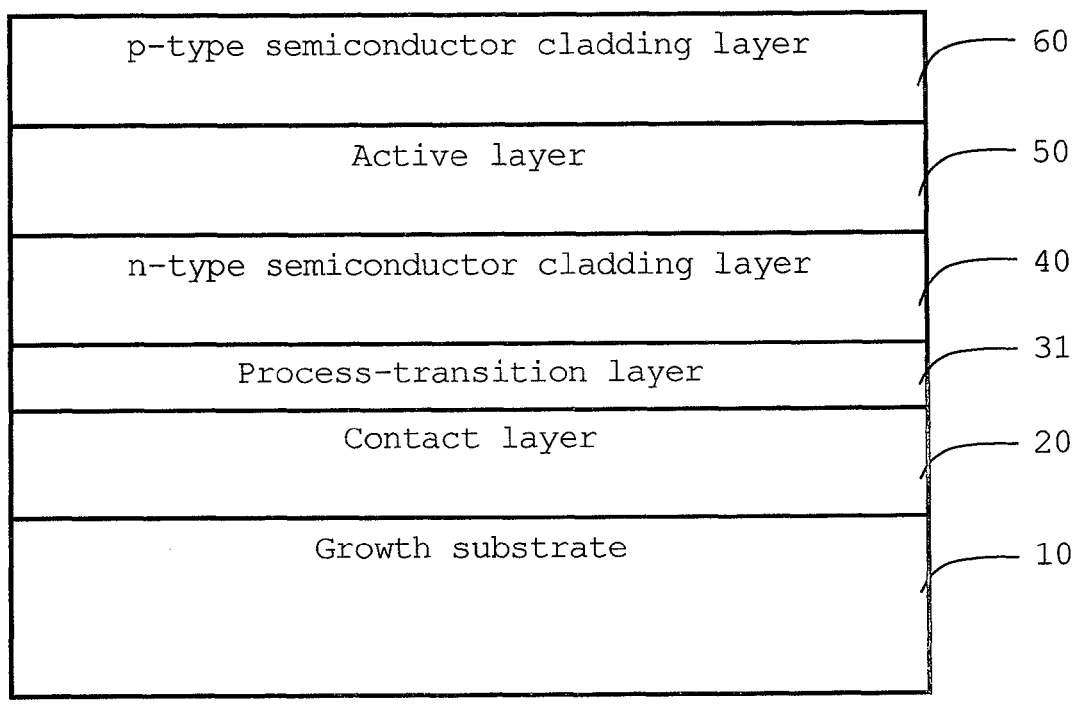
FIG. 1 shows a light-emitting epitaxy structure in accordance with a first embodiment of the present disclosure.

FIG. 1 shows a light-emitting epitaxy structure of a light-emitting device in accordance with a first embodiment of the present disclosure. The light-emitting epitaxy structure 1 comprises a growth substrate 10, a contact layer 20 formed on the growth substrate 10, a process-transition layer 31 formed on the contact layer 20, an n-type semiconductor cladding layer 40 formed on the process-transition layer 31, an active layer 50 formed on the n-type semiconductor cladding layer 40, and a p-type semiconductor cladding layer 60 formed on the active layer 50. The method for forming the light-emitting epitaxy structure 1 comprises the steps of providing the growth substrate 10, epitaxially growing the contact layer 20 on the growth substrate 10 by a metal-organic chemical vapor deposition (MOCVD) method. If the lattice constant of the contact layer 20 is different from the growth substrate 10, a lattice-buffer layer (not shown) can be selectively grown between the contact layer 20 and the growth substrate 10, wherein the lattice constant of the lattice-buffer layer is between the lattice constants of the contact layer 20 and the growth substrate 10 for improving the epitaxy quality and decreasing epitaxial defects. A growth condition e.g. the set value of the chamber temperature as around 900-1200° C. and the chamber pressure as around 300-450 mbar, is applied for epitaxially growing the contact layer 20. An n-type impurity with an impurity concentration of around $1*10^{17}$-$1*10^{18}$ cm$^{-3}$ is introduced into the contact layer 20 during growing. After growing the contact layer 20, the process-transition layer 31 and the n-type semiconductor cladding layer 40 are subsequently grown on the contact layer 20. The n-type semiconductor cladding layer 40 comprises an n-type impurity and an impurity concentration. A process change, or preferred a sharp process change in growth condition exists between the n-type semiconductor cladding layer 40 and the contact layer 20 and causes the epitaxy thin film defective and the epitaxy quality worse when the n-type semiconductor cladding layer 40 is grown directly on the contact layer 20. Consequently, the process-transition layer 31 located between the contact layer 20 and the n-type semiconductor cladding layer 40 reduces the crystal defects caused by the process change in growth condition between the contact layer 20 and the n-type semiconductor cladding layer 40, so that the epitaxy quality is improved. The definition of "growth condition" in accordance with the present disclosure comprises at least one set value of process parameter selected from the group consisting of chamber temperature, chamber pressure, gas flow, and other process parameters. The definition of "process change" in accordance with the present disclosure is the growth condition of a precedent layer grown before the process-transition layer 31 being at least 3% different from the corresponding growth condition of a subsequent layer grown after the process-transition layer 31; and the definition of "sharp process change" in accordance with the present disclosure is the growth condition of a precedent layer grown before the process-transition layer 31 being at least 10% different from the corresponding growth condition of a subsequent layer grown after the process-transition layer 31. For example, for growing the n-type semiconductor cladding layer 40, the set value of the chamber temperature is around 700~1000° C., and the set value of the chamber pressure is around 200~350 mbar, wherein at least one of the set value of the chamber temperature and the set value of the chamber pressure is at least 3%, or preferable 10% different from the corresponding chamber temperature or chamber pressure for growing the contact layer 20. The growth condition for growing the process-transition layer 31 is between the corresponding growth condition of the contact layer 20 and the n-type semiconductor cladding layer 40, or is preferred to be close to the growth condition of the n-type semiconductor cladding layer 40, or is much preferred to be the same as the growth condition of the n-type semiconductor cladding layer 40. The process-transition layer 31 comprises an n-type impurity and an impurity concentration, e.g. around $5*10^{17}$~$1*10^{20}$ cm$^{-3}$, greater than the impurity concentration of the contact layer 20 and/or the n-type semiconductor cladding layer 40. Preferably, the impurity concentration of the process-transition layer 31 is greater than both the impurity concentrations of the contact layer 20 and the n-type semiconductor cladding layer 40 such that the electrical conductivity of the process-transition layer 31 is greater than that of the contact layer 20 and/or the n-type semiconductor cladding layer 40. The method for doping impurities into the process-transition layer 31 can be uniform doping, much preferred modulation-doping, or most preferred graded-doping. The active layer 50 and the p-type semiconductor cladding layer 60 are subsequently grown on the n-type semiconductor cladding layer 40 afterward to form the light-emitting epitaxy structure 1 of a light-emitting device in accordance with the present disclosure.

Figure 2:
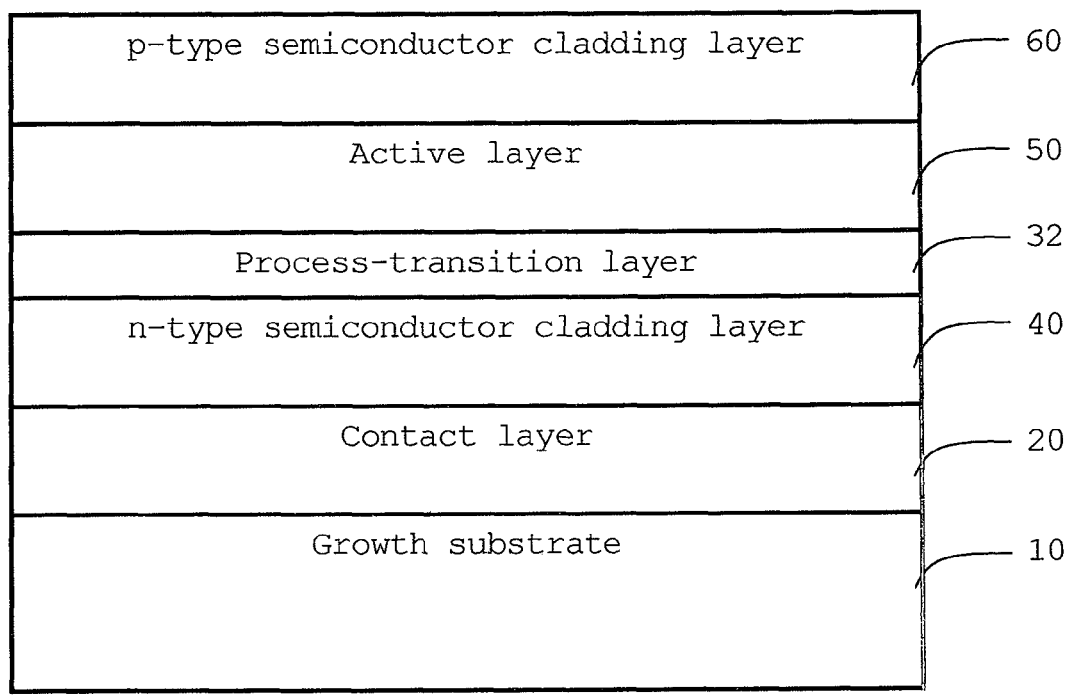
FIG. 2 shows a light-emitting epitaxy structure in accordance with a second embodiment of the present disclosure.

FIG. 2 shows a second embodiment of a light-emitting epitaxy structure in accordance with the present disclosure. The light-emitting epitaxy structure 2 comprises a growth substrate 10, a contact layer 20 formed on the growth substrate, an n-type semiconductor cladding layer 40 formed on the contact layer 20, a process-transition layer 32 formed on the n-type semiconductor cladding layer 40, an active layer 50 formed on the process-transition layer 32, and a p-type semiconductor cladding layer 60 formed on the active layer 50. The difference between the present embodiment and the first embodiment as shown in FIG. 1 is that the process-transition layer 32 is formed between the n-type semiconductor cladding layer 40 and the active layer 50. The method for forming the light-emitting epitaxy structure 2 comprises the steps of providing the growth substrate 10, epitaxially growing the contact layer 20 on the growth substrate by a metal-organic chemical vapor deposition (MOCVD) method. If the lattice constant of the contact layer 20 is different from that of the growth substrate 10, a lattice-buffer layer (not shown) can be selectively grown between the contact layer 20 and the growth substrate 10, wherein the lattice constant of the lattice-buffer layer is between the lattice constants of the contact layer 20 and the growth substrate 10 for improving epitaxy quality and decreasing epitaxial defects. After growing the contact layer 20, the n-type semiconductor cladding layer 40 is subsequently grown on the contact layer 20. The n-type semiconductor cladding layer 40 comprises an n-type impurity and an impurity concentration. The growth condition, e.g. the set value of the chamber temperature and the chamber pressure set around 700-1000° C. and 200-350 mbar, is applied for epitaxially growing the n-type semiconductor cladding layer 40. An n-type impurity with an impurity concentration of around $1*10^{17}$-$5*10^{18}$ cm$^{-3}$ is introduced into the contact layer 20 during growth. The process-transition layer 32 and the active layer 50 are subsequently grown on the n-type semiconductor cladding layer. A process change, or preferred a sharp process change in growth condition exists between the n-type semiconductor cladding layer 40 and the active layer 50 and causes the epitaxy thin film defective and the epitaxy quality worse when the active layer 50 is grown directly on the n-type semiconductor cladding layer 40. Consequently, the process-transition layer 32 located between the n-type semiconductor cladding layer 40 and the active layer 50 reduces the crystal defects caused by the process change in growth condition between the n-type semiconductor cladding layer 40 and the active layer 50, so that the epitaxy quality is improved. For example, for growing the active layer 50, the set value of the chamber temperature is around 850~1100° C., and the set value of the chamber pressure is around 200~350 mbar, wherein at least one of the set value of the chamber temperature and the set value of the chamber pressure is at least 3%, or preferable 10% different from the corresponding chamber temperature or chamber pressure for growing the n-type semiconductor cladding layer 40. The growth condition for growing the process-transition layer 32 is between the corresponding growth condition of the n-type semiconductor cladding layer 40 and the active layer 50, or is preferred to be close to the growth condition of the active layer 50, or is much preferred to be the same as the growth condition of the active layer 50. The process-transition layer 32 comprises an n-type impurity and an impurity concentration, e.g. around $5*10^{17} \sim 1*10^{19}$ cm$^{-3}$, greater than the impurity concentration of the n-type semiconductor cladding layer 40 and/or the active layer 50. Preferably, the impurity concentration of the process-transition layer 32 is greater than both the impurity concentrations of the n-type semiconductor cladding layer 40 and the active layer 50 such that the electrical conductivity of the process-transition layer 32 is greater than that of the n-type semiconductor cladding layer 40 and the active layer 50. The method for doping impurities into the process-transition layer 32 can be uniform doping, much preferred modulation-doping, or most preferred graded-doping. The p-type semiconductor cladding layer 60 is subsequently grown on the active layer 50 afterward to form the light-emitting epitaxy structure 2 of a light-emitting device in accordance with the present disclosure. The active layer comprises a multi-quantum well (MQW) structure for enhancing the internal quantum efficiency of the light-emitting device.

Figure 3:
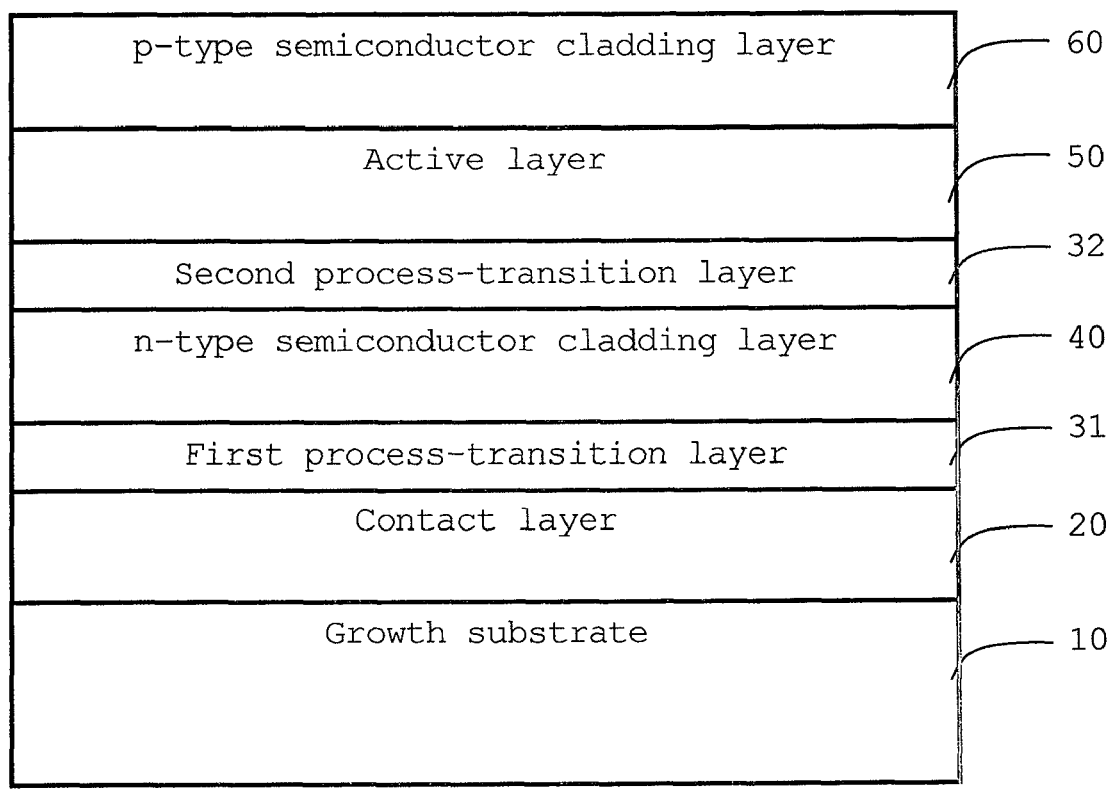
FIG. 3 shows a light-emitting epitaxy structure in accordance with a third embodiment of the present disclosure.

FIG. 3 shows a third embodiment of a light-emitting epitaxy structure in accordance with the present disclosure. The difference between the present embodiment and the foregoing first and second embodiments is that the light-emitting epitaxy structure 3 comprises both a first process-transition layer 33 which is formed between the contact layer 20 and the n-type semiconductor cladding layer 40 similar to the first embodiment and a second process-transition layer 34 formed between the n-type semiconductor cladding layer 40 and the active layer 50 similar to the second embodiment for further enhancing the epitaxy quality of a light-emitting device in accordance with the present disclosure.

Figure 4:
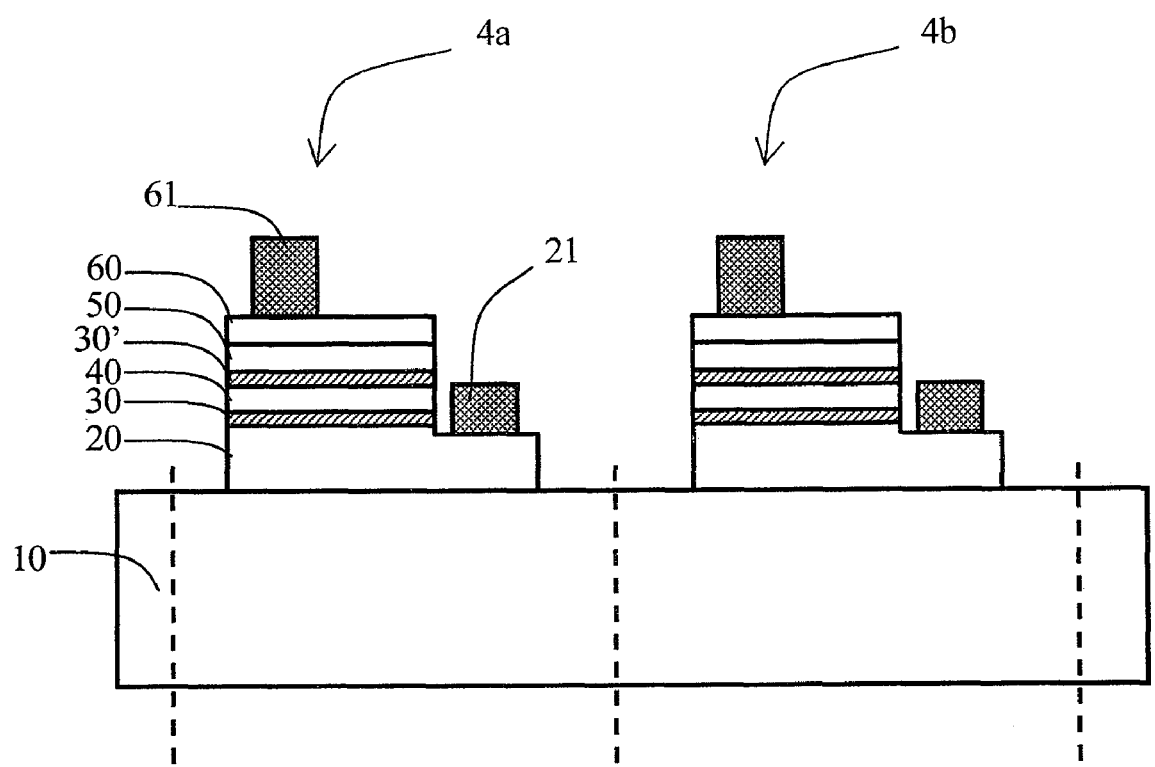
FIG. 4 shows a light-emitting device in accordance with a first embodiment of the present disclosure.

FIG. 4 shows a light-emitting device of a first embodiment in accordance with the present disclosure. The light-emitting device 4 comprises a plurality of divided light-emitting segments, e.g. light-emitting segments 4a and 4b, commonly formed on a growth substrate 10 by processing the foregoing light-emitting epitaxy structure, e.g. the light-emitting epitaxy structure 3 as shown in FIG. 3 with a known chip process. A first electrode 21 is formed on an exposed area of the contact layer 20 and a second electrode 61 is formed on the p-type semiconductor cladding layer 60. After the chip process, the growth substrate 10 is diced to separate the light-emitting segments 4a and 4b to form individual light-emitting devices. In another embodiment in accordance with the present disclosure, the light-emitting device further comprises a second contact layer formed between the second electrode 61 and the p-type semiconductor cladding layer 60 to reduce the contact resistance between the second electrode 61 and the p-type semiconductor cladding layer 60, or a current spreading layer is formed between the second electrode 61 and the p-type semiconductor cladding layer 60 to distribute current uniformly within the light-emitting epitaxy structure.

In one embodiment of the present disclosure, the growth substrate of the light-emitting device has a dimension of, for example, around 10 mils by 10 mils, and has a modulus of a critical reverse voltage not less than 50 volts while the light-emitting device is reverse-biased at a current density of $-10$ μA/mm$^2$. Also, the light-emitting device has a luminous efficiency not less than 50 lumen/Watt while the light-emitting device is forward-biased at a current density of 150 mA/mm$^2$. In another embodiment in accordance with the present disclosure, a modulus of the critical reverse voltage is preferred not less than 60 volts, much preferred not less than 70 volts, and most preferred not less than 100 volts, that can be achieved by adjusting the growth condition or the impurity concentration of the process-transition layer according to the present disclosure.

Figure 6:
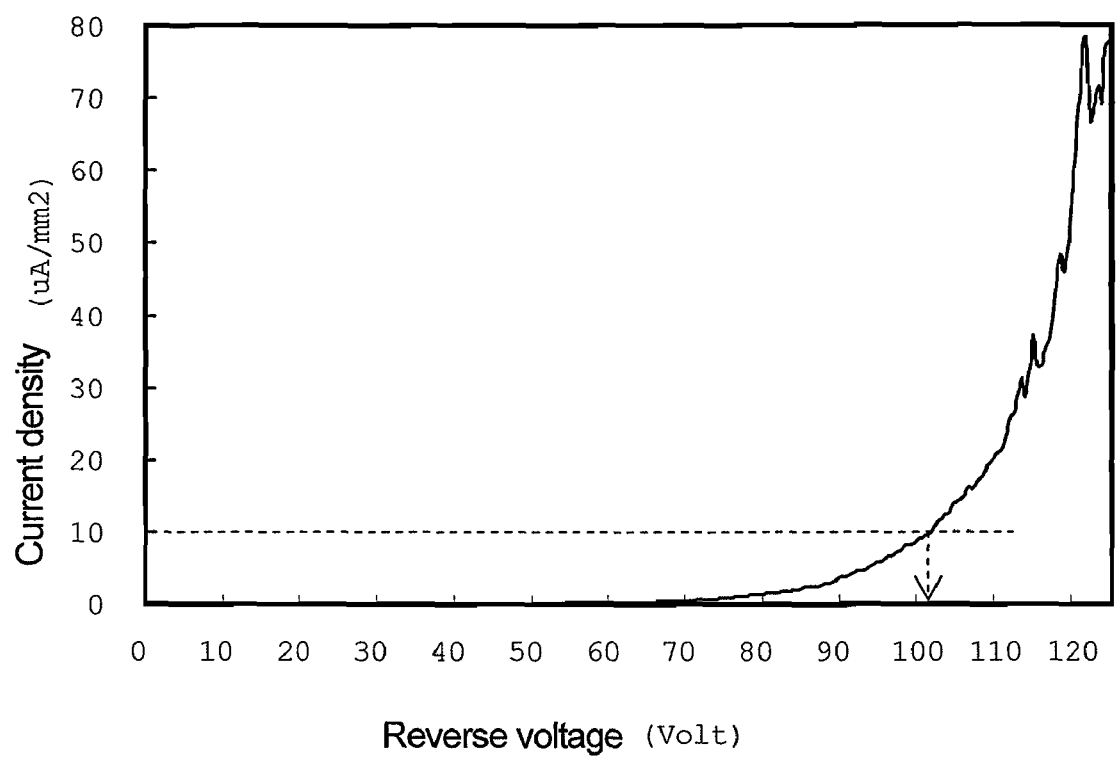
FIG. 6 demonstrates an I-V correlation diagram in accordance with the present disclosure.

FIG. 6 exemplifies an I-V correlation diagram of a light-emitting device in accordance with the present disclosure. When the light-emitting device is reverse-biased at a current density of $-10$ μA/mm$^2$, a modulus of a corresponding critical reverse voltage is around 102 volts (as the dash-line indicated; the data shown in this figure are transformed to absolute values). When the light-emitting device is forward-biased at a current density of 150 mA/mm$^2$, the luminous efficiency is not less than 50 lumen/Watt. The light-emitting device in accordance with the present disclosure possesses both the characteristics of high critical reverse voltage and high luminous efficiency.

Figure 5:
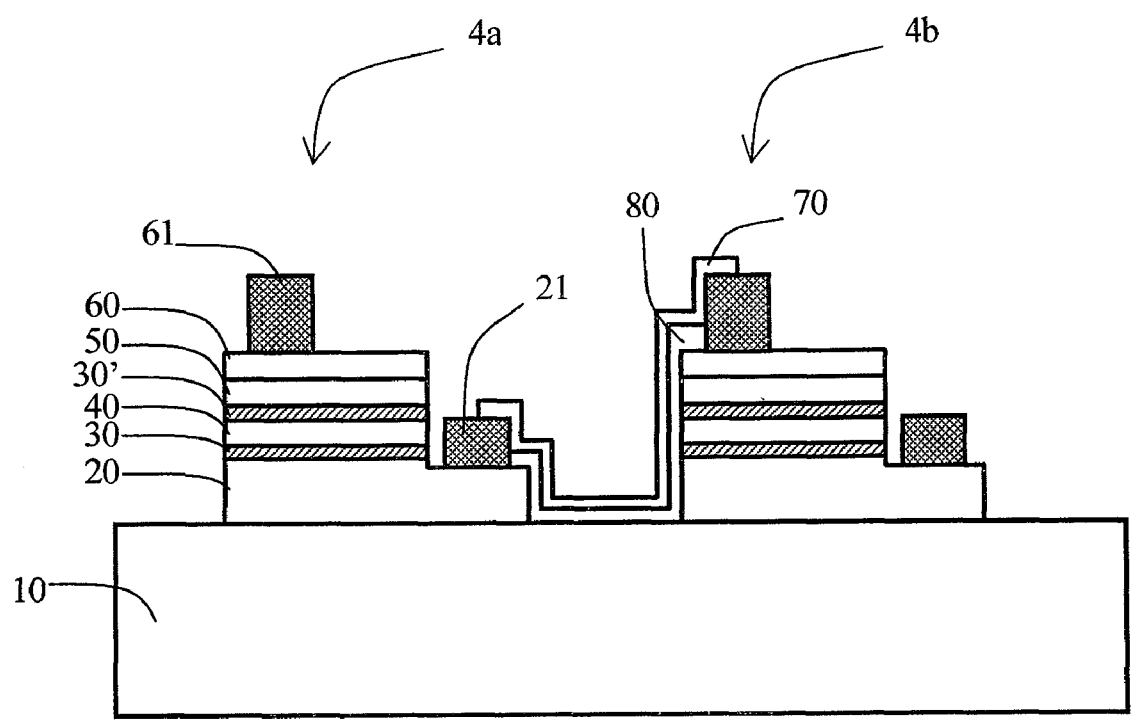
FIG. 5 shows a light-emitting device in accordance with a second embodiment of the present disclosure.

FIG. 5 shows a serial-connected light-emitting device in accordance with the present disclosure. The method for forming the serial-connected light-emitting device 5 is similar to that described in the foregoing embodiment shown in FIG. 4. After the chip process, instead of dicing the growth substrate 10 to separate the light-emitting segments 4a and 4b to form individual light-emitting devices, the light-emitting segments are electrically connected by a connecting layer 70 connecting a first electrode 21 of a light-emitting segment 4a and a second electrode 61 of a light-emitting segments 4b to form a serial-connected light-emitting arrayed structure as shown in FIG. 5. The light-emitting device 5 further comprises an insulating layer 80 formed between the connecting layer 70 and the light-emitting segments 4a and 4b, and between the connecting layer 70 and the growth substrate 10 to prevent the circuit in the light-emitting device from short.

Figure 7A:
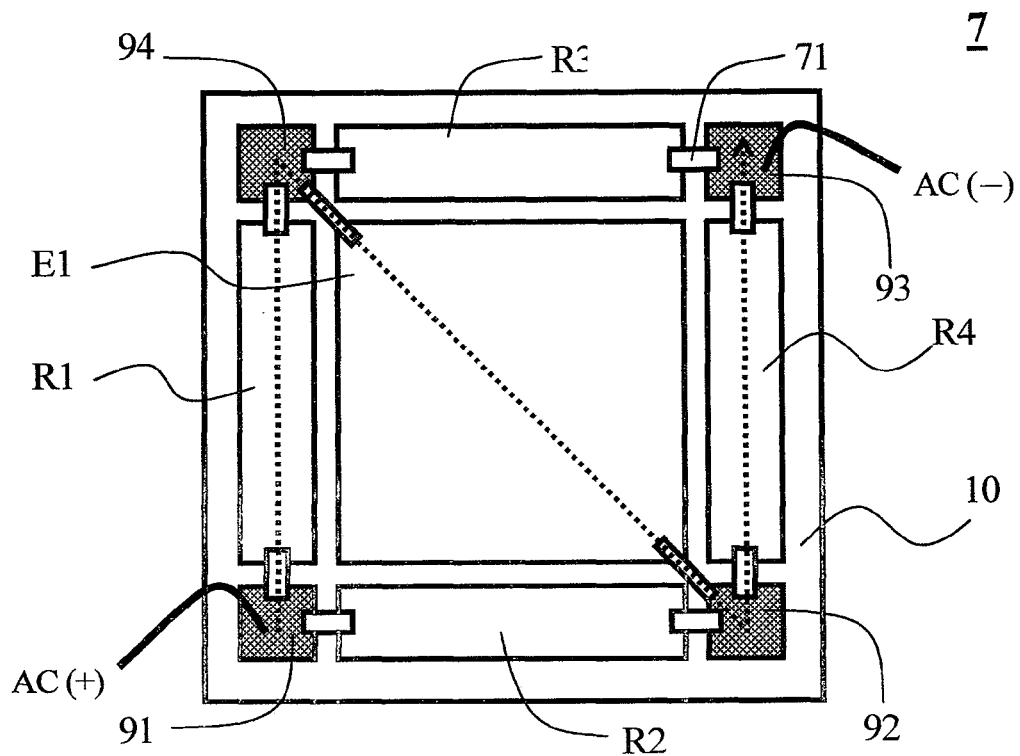
FIG. 7A shows a top-view of an alternating-current light-emitting device in accordance with one embodiment of the present disclosure.
Figure 7B:
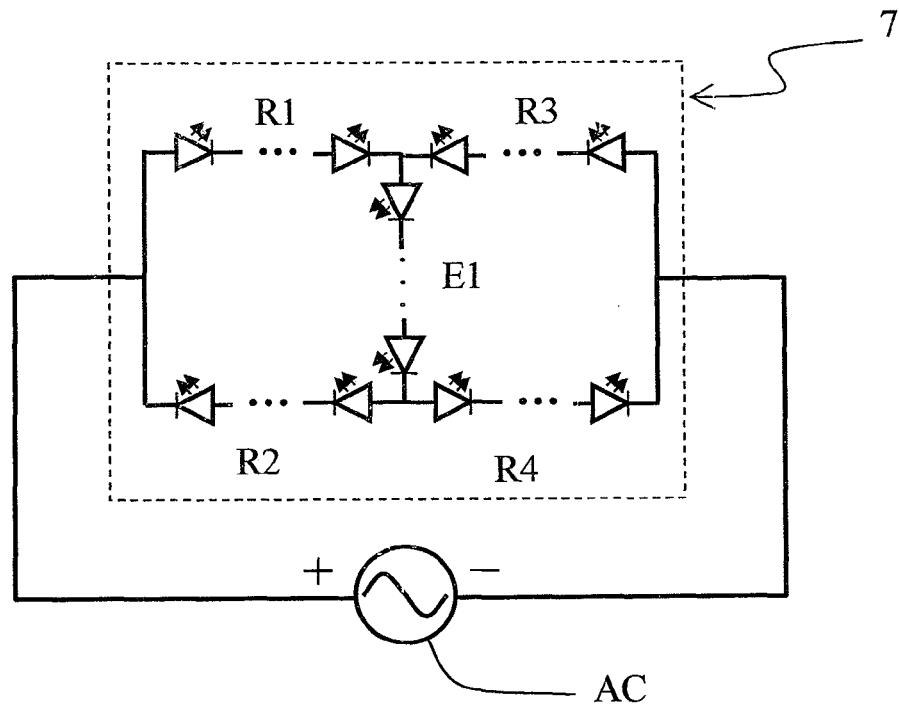
FIG. 7B shows a circuit of an alternating-current light-emitting device in accordance with one embodiment of the present disclosure.

FIG. 7A and FIG. 7B disclose an alternating-current light-emitting device (ACLED) in accordance with the present disclosure. The ACLED 7, applied to an alternating-current (AC) power source, comprises a plurality of rectifying light-emitting arrayed structures (RLEASs) R1~R4 and at least one direct-current light-emitting arrayed structure (DCLEAS) E1 commonly grown on a growth substrate 10. Each of the RLEASs and DCLEAS comprises a plurality of serial-connected light-emitting segments. The RLEASs R1~R4 comprise a second connecting layer 71, a first conductive electrode 91, a second conductive electrode 92, a third conductive electrode 93, and a fourth conductive electrode 94 interconnected in a Wheatstone bridge connection to form a bridge rectifier. Referring to FIG. 7B, the RLEAS R1 is connected to the first conductive electrode 91 and the fourth conductive electrode 94; the RLEAS R2 is connected to the first conductive electrode 91 and the second conductive electrode 92; the RLEAS R3 is connected to the third conductive electrode 93 and the fourth conductive electrode 94; the RLEAS R4 is connected to the second conductive electrode 92 and the third conductive electrode 93; the first conductive electrode 91 and the third conductive electrode 93 are electrically connected to the anode and cathode of the AC power source respectively for receiving an AC voltage signal. The AC voltage signal is rectified by the RLEASs R1~R4 to output a direct-current (DC) voltage signal in the second conductive electrode 92 and the fourth conductive electrode 94. The DCLEAS E1 is connected between the second conductive electrode 92 and the fourth conductive electrode 94 for receiving the DC voltage signal. When the AC voltage signal is at a positive cycle of a period, current flows into RLEAS R1, DCLEAS E1, RLEAS R4 of the ACLED 7 (shown as the dash-line in FIG. 7A) and light emits. When the AC voltage signal is at a negative cycle of a period, current flows into RLEAS R3, DCLEAS E1, RLEAS R2 of the ACLED 7 and light emits. Each of the RLEASs R1~R4 emits light during the according forward-biased half cycle, and emit no light at another half cycle of reverse-bias. Specifically, the RLEASs R1~R4 take turns to emit light during the positive and negative cycles of the AC voltage signal; the DCLEAS E1 emits light at both positive and negative cycles of the AC voltage signal because the signal entering the DCLEAS E1 has been rectified to the DC voltage signal.

The light-emitting segment in accordance with the present disclosure has a high critical reverse voltage to increase the capability of resisting the reverse-bias driving, and has much lower number of the light-emitting segments to be used in the RLEASs. Therefore, the number of the light-emitting segments in the DCLEAS can be increased to improve luminous efficiency. Take an 110V power source with 60 Hz AC frequency as an example, each light-emitting segment has the same area and comprises e.g. a gallium nitride (GaN) based light-emitting epitaxy structure with a forward voltage around 3 volts and a modulus of a critical reverse voltage y. The total number of the light-emitting segments that current flows through during the positive cycle or the negative cycle is about 37 in order to meet the 110V power source. Each RLEASs R1~R4 comprises the same number m of the light-emitting segments; the DCLEAS E1 comprises a number n of the light-emitting segments. The percentage of the number of the light-emitting segments of the DCLEAS E1 to the total number of the light-emitting segments of the light-emitting device is n/(4 m+n)*100%. When the AC voltage signal is at a negative cycle of a period, the voltage across the RLEAS R2 which is reverse-biased in-between the first conductive electrode 91 and the second conductive electrode 92 should be 3*(m+n) volts the same as the voltage across the RLEAS R1 and DCLEAS E1 which are forward-biased in-between the first conductive electrode 91 and the second conductive electrode 92. In order to prevent the RLEAS R2 that is reverse-biased from breakdown, y has to be at least 35 more than [3*(m+n)]/m to cover the variation during electrical operation and other environmental factors that might cause device failure. Specifically, y has to satisfy the equation hereunder:

$$y > \frac{3*(m+n)}{m} + 35$$

Table 1 lists the combinations of the number of the light-emitting segments in each of the light-emitting arrayed structures of the ACLED in accordance with the present disclosure.

TABLE 1

| | m | n | $\frac{n}{n+4m}*100\%$ | $\frac{3*(m+n)}{m}+35$ |
|---|---|---|---|---|
| Combination A | 1 | 35 | 90% | 143 |
| Combination B | 2 | 33 | 80% | 87.5 |
| Combination C | 3 | 31 | 72% | 69 |
| Combination D | 4 | 29 | 64% | 60 |
| Combination E | 5 | 27 | 57% | 54 |
| Combination F | 6 | 25 | 51% | 51 |

According to the embodied combinations as shown in Table 1, The percentage of the number of the light-emitting segments of the DCLEAS E1 to the total number of the light-emitting segments of the ACLED 7 is not less than 50% (combination A~F), preferably not less than 60% (combination A~D), more preferably not less than 70% (combination A~C) or not less than 80% (Combination A, B), or most preferably not less than 90% (Combination A) to achieve better luminous efficiency. In another aspect of the present disclosure, the modulus of the critical reverse voltage of the light-emitting segment is not less than 50V (combination A~F), preferably not less than 60V (combination A~D), more preferably not less than 70V (combination A~B), or most preferably not less than 100V (Combination A) to increase the reliability of the light-emitting device.

According to another embodiment of the present disclosure, the area of each of the light-emitting segments in the RLEASs is smaller than the area of each of the light-emitting segments in the DCLEAS for further improving the capability of resisting reverse-bias driving. Although the present disclosure explicitly exemplifies the ACLED with the bridge rectifier in FIG. 7A and FIG. 7B and their corresponding description, an ACLED with other connections, e.g. anti-parallel connection is still under the scope the present disclosure.

Figure 8:
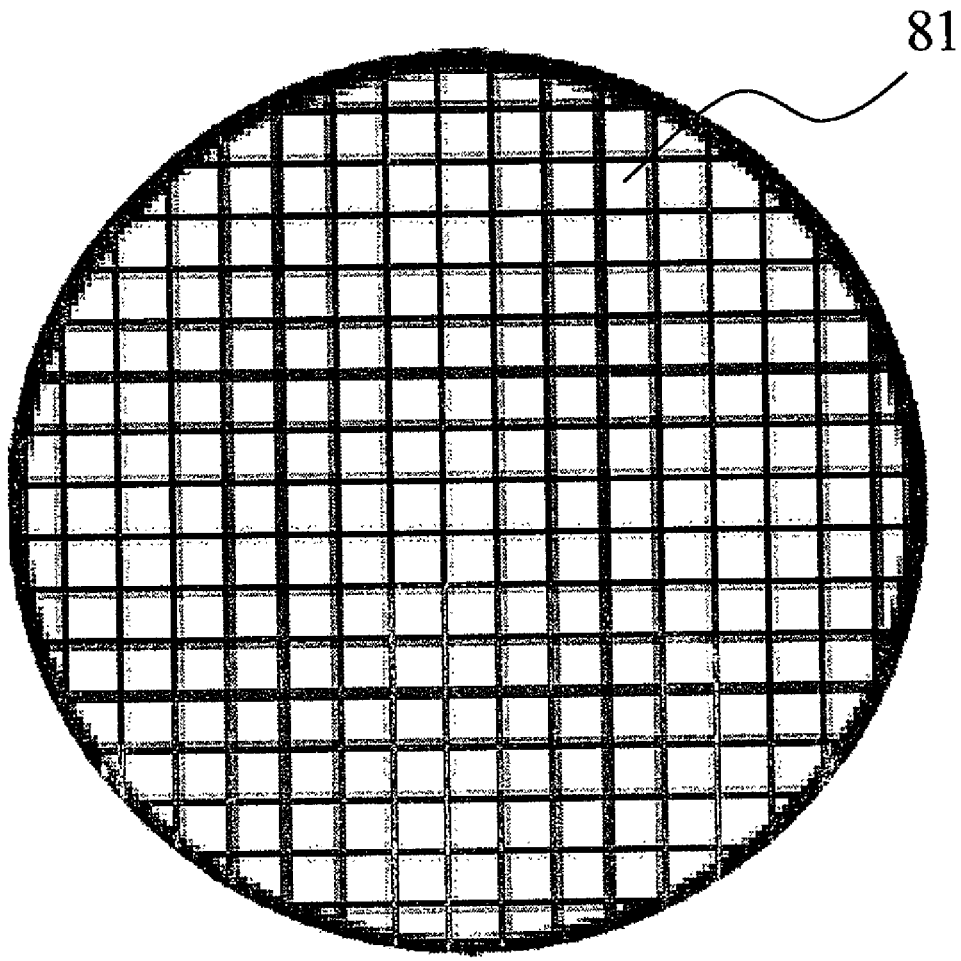
FIG. 8 shows a light-emitting wafer in accordance with one embodiment of the present disclosure.

FIG. 8 shows a light-emitting wafer in accordance with the present disclosure. The light-emitting wafer 8 comprises a plurality of light-emitting segments 81. Each light-emitting segment 81 comprises a light-emitting epitaxy structure, e.g. the same as the light-emitting segments 4a or 4b as shown in FIG. 4 and its related description. Each of the light-emitting segments has a critical reverse voltage at a current density of −10 μA/mm², and has a luminous efficiency while it is forward-biased at a current density of 150 mA/mm². An average of the modulus of the critical reverse voltage of the plurality of the light-emitting segments is not less than 50V, preferably not less than 60V, more preferably not less than 70V, or most preferably not less than 100V. The average of the luminous efficiency of the plurality of the light-emitting segments is not less than 50 lumen/watt. In another embodiment in accordance with the present disclosure, the critical reverse voltage of the plurality of the light-emitting segments has a distribution sorted by magnitude. After excluding top and last 25% of the distribution, the average of the critical reverse voltages of the plurality of the light-emitting segments of the rest 50% in the middle of the distribution is not less than 50V, preferably not less than 60V, more preferably not less than 70V, and most preferably not less than 100V, and the average of the luminous efficiency of the plurality of the light-emitting segments of the rest 50% in the middle of the distribution forward-biased at a current density of 150 mA/mm² is not less than 501 m/w.

The materials of the contact layer, the n-type semiconductor cladding layer, the process-transition layer, the p-type semiconductor cladding layer, and the active layer in the foregoing embodiments comprise III-V compound, e.g. gallium-nitride based compound or gallium-phosphide based compound. The growth substrate comprises at least one material selected from the group consisting of sapphire, SiC, GaN, and AlN. The contact layer, the n-type semiconductor cladding layer, the p-type semiconductor cladding layer, and the active layer comprise single-layered or multiple-layered structure, e.g. superlattice structure. The light-emitting epitaxy structure in accordance with the present disclosure is not limited to be grown on the growth substrate. Other forming methods, e.g. directly bonded or bonded through a medium to a thermally conductive substrate or an electrically conductive substrate, are still under the scope of the present disclosure.

It will be apparent to those having ordinary skill in the art that various modifications and variations can be made to the methods in accordance with the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A light-emitting device comprising at least one light-emitting segment, each of which comprises a light-emitting epitxay structure, wherein the light-emitting epitaxy structure has a modulus of a critical reverse voltage not less than 50 volts while the light-emitting epitaxy structure is reverse-biased at a current density of $-10\ \mu A/mm^2$.

2. The light-emitting device according to claim 1, wherein the light-emitting epitaxy structure has a luminous efficiency not less than 50 lumen/Watt while the light-emitting epitaxy structure is forward-biased at a current density of 150 $mA/mm^2$.

3. The light-emitting device according to claim 1, wherein the light-emitting epitaxy structure has a modulus of a critical reverse voltage not less than 100 volts while the light-emitting epitaxy structure is reverse-biased at a current density of $-10\ \mu A/mm^2$.

4. The light-emitting device according to claim 1, wherein the light-emitting epitaxy structure comprises:
   a contact layer;
   an n-type semiconductor layer on the contact layer;
   a p-type semiconductor layer on the n-type semiconductor layer; and
   an active layer interposed between the n-type semiconductor layer and the p-type semiconductor layer.

5. The light-emitting device according to claim 4, wherein the light-emitting epitaxy structure further comprises a process-transition layer interposed between the n-type semiconductor layer and the active layer, wherein the electrical conductivity of the process-transition layer is greater than that of the n-type semiconductor layer or the active layer.

6. The light-emitting device according to claim 5, wherein the process-transition layer comprises an impurity and an impurity concentration greater than that of the n-type semiconductor layer and the active layer.

7. The light-emitting device according to claim 4, wherein the light-emitting epitaxy structure further comprises a process-transition layer interposed between the contact layer and the n-type semiconductor layer; and wherein the electrical conductivity of the process-transition layer is greater than that of the n-type semiconductor layer or the contact layer.

8. The light-emitting device according to claim 7, wherein the process-transition layer comprises an impurity and an impurity concentration greater than that of the n-type semiconductor layer and/or the contact layer.

9. The light-emitting device according to claim 1, comprising a plurality of light-emitting arrayed structures, each of which is formed by a plurality of the light-emitting segments commonly grown on a growth substrate.

10. The light-emitting device according to claim 9, wherein the light-emitting arrayed structures comprises a plurality of rectifying light-emitting arrayed structures and at least one direct-current light-emitting arrayed structure; wherein each of the rectifying light-emitting arrayed structures comprises a first number of the light-emitting segments serially connected, and the rectifying light-emitting arrayed structures forms a Wheatstone bridge connection having two input terminals for receiving an alternating-current voltage signal and two output terminals for outputting a direct-current voltage signal; and wherein the direct-current light-emitting arrayed structure comprises a second number of the light-emitting segments and connects to the two output terminals.

11. The light-emitting device according to claim 10, wherein a percentage of the second number to the sum of the first number and the second number is not less than 50%.

12. The light-emitting device according to claim 9, wherein the light-emitting arrayed structures connects in an anti-parallel connection having two input terminals for receiving an alternating-current voltage signal.

13. A light-emitting wafer comprising:
   a plurality of light-emitting segments, each of which comprises a light-emitting epitxay structure;
   wherein each of the light-emitting segments has a critical reverse voltage at a current density of $-10\ \mu A/mm^2$, and an average of the modulus of the critical reverse voltages of the plurality of the light-emitting segments is not less than 50 volts.

14. The light-emitting wafer according to claim 13, wherein an average of the modulus of the critical reverse voltages of the plurality of the light-emitting segments is not less than 100 volts.

15. The light-emitting wafer according to claim 13, wherein the critical reverse voltages of the plurality of the light-emitting segments has a distribution sorted by magnitude, and after excluding top, and last 25% of the distribution, an average of the modulus of the critical reverse voltages of the plurality of the light-emitting segments is calculated on the basis of the rest 50% in the middle of the distribution.

16. The light-emitting wafer according to claim 13, wherein the light-emitting epitaxy structure comprises a contact layer, an n-type semiconductor layer on the contact layer, a p-type semiconductor layer on the n-type semiconductor layer, and an active layer interposed between the n-type semiconductor layer and the p-type semiconductor layer.

17. The light-emitting wafer according to claim 16, further comprises a process-transition layer interposed between the n-type semiconductor layer and the active layer; wherein the electrical conductivity of the process-transition layer is greater than that of the n-type semiconductor layer or the active layer.

18. The light-emitting wafer according to claim 17, wherein the process-transition layer comprises an impurity and an impurity concentration greater than that of the n-type semiconductor layer and the active layer.

19. The light-emitting wafer according to claim 16, wherein the light-emitting epitaxy structure further comprises a process-transition layer interposed between the contact layer and the n-type semiconductor layer; wherein the electrical conductivity of the process-transition layer is greater than that of the n-type semiconductor layer or the contact layer.

20. The light-emitting wafer according to claim 19, wherein the process-transition layer comprises an impurity and an impurity concentration greater than that of the n-type semiconductor layer and the contact layer.

* * * * *